(12) United States Patent
Dong

(10) Patent No.: US 10,608,204 B2
(45) Date of Patent: Mar. 31, 2020

(54) ENCAPSULATION STRUCTURE-CONTAINING DISPLAY DEVICE, METHOD FOR PRODUCING THE SAME, ARRAY SUBSTRATE AND DISPLAY APPARATUS

(71) Applicant: BOE Technology Group Co., Ltd., Beijing (CN)

(72) Inventor: Tian Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/975,336

(22) Filed: May 9, 2018

(65) Prior Publication Data

US 2019/0067640 A1 Feb. 28, 2019

(30) Foreign Application Priority Data

Aug. 25, 2017 (CN) .......................... 2017 1 0749368

(51) Int. Cl.
| | | |
|---|---|---|
| *H01L 51/52* | (2006.01) | |
| *H01L 27/32* | (2006.01) | |
| *H01L 51/56* | (2006.01) | |
| *H01L 51/50* | (2006.01) | |
| *H01L 51/00* | (2006.01) | |

(52) U.S. Cl.
CPC ...... *H01L 51/5256* (2013.01); *H01L 51/5056* (2013.01); *H01L 51/5072* (2013.01); *H01L 51/5092* (2013.01); *H01L 51/56* (2013.01); *H01L 27/32* (2013.01); *H01L 51/0097* (2013.01); *H01L 51/5253* (2013.01); *H01L 2251/5338* (2013.01)

(58) Field of Classification Search
CPC . H01L 51/5256; H01L 51/56; H01L 51/5092; H01L 51/5056; H01L 51/5072; H01L 51/5338; H01L 51/0097
USPC ......... 257/40, 72, 787; 438/82, 99, 112, 124
See application file for complete search history.

(56) References Cited

U.S. PATENT DOCUMENTS

| | | | |
|---|---|---|---|
| 2005/0023974 A1* | 2/2005 | Chwang et al. .... | H01L 51/5253 313/512 |
| 2010/0148127 A1* | 6/2010 | Ellinger et al. ....... | H01L 51/107 252/500 |
| 2016/0343988 A1* | 11/2016 | Meyer et al. ....... | H01L 51/5256 |

\* cited by examiner

*Primary Examiner* — Thinh T Nguyen
(74) *Attorney, Agent, or Firm* — Westman, Champlin & Koehler, P.A.

(57) ABSTRACT

Provided are an encapsulation structure-containing display device, a method for producing the same, an array substrate and a display apparatus. The display device has a base substrate, function layers on the base substrate, and an encapsulation unit on the function layers, wherein the encapsulation unit is in contact with the base substrate around the function layers, to encapsulate the function layers; wherein the base substrate comprises a first substrate, a first moisture-oxygen-blocking organic layer on the first substrate, and a second substrate on the first moisture-oxygen-blocking organic layer; wherein the function layers are on the second substrate; wherein the encapsulation unit comprises a second moisture-oxygen-blocking organic layer, wherein the second moisture-oxygen-blocking organic layer is in contact with the first moisture-oxygen-blocking organic layer around the function layers and combines with the first moisture-oxygen-blocking organic layer at the contact surface to form an one-piece structure.

9 Claims, 3 Drawing Sheets

ENCAPSULATION STRUCTURE-CONTAINING DISPLAY DEVICE, METHOD FOR PRODUCING THE SAME, ARRAY SUBSTRATE AND DISPLAY APPARATUS

CROSS REFERENCE OF RELATED APPLICATION

This disclosure claims the priority of Chinese Patent Application No. 201710749368.1 filed on Aug. 25, 2017, which is incorporated herein in its entirety by reference.

TECHNICAL FIELD

This disclosure relates to the technical field of encapsulation, in particular, to an encapsulation structure-containing display device, a method for producing the same, an array substrate and a display apparatus.

BACKGROUND ART

Organic light emitting diodes (OLEDs) display has been widely used in various electronic apparatuses, including electronic products, such as computer, cellphone, and the like, due to having advantages, including self-lighting, being light and thin, low energy consumption, high contrast, large color range, capability of flexible displaying, and the like.

The OLED device in the OLED display is very sensitive to moisture and oxygen, and tends to react with the components in the air, such as moisture, oxygen, and the like. It then results in the failure of the OLED device. Therefore, for an encapsulation structure for an OLED in the OLED display, blocking moisture and oxygen should be noticed particularly. It is needed to isolate the OLED device from the moisture and oxygen in the environment, to extend the life time of the OLED device.

SUMMARY

In one aspect, this disclosure provides an encapsulation structure-containing display device, comprising
a base substrate,
function layers on the base substrate, and
an encapsulation unit on the function layers,
wherein the encapsulation unit is in contact with the base substrate around the function layers, to encapsulate the function layers;
wherein the base substrate comprises a first substrate, a first moisture-oxygen-blocking organic layer on the first substrate, and a second substrate on the first moisture-oxygen-blocking organic layer;
wherein the function layers are on the second substrate;
wherein the encapsulation unit comprises a second moisture-oxygen-blocking organic layer, wherein the second moisture-oxygen-blocking organic layer is in contact with the first moisture-oxygen-blocking organic layer around the function layers and combines with the first moisture-oxygen-blocking organic layer at the contact surface to form a one-piece structure.

Optionally, the second moisture-oxygen-blocking organic layer combines with the first moisture-oxygen-blocking organic layer at the contact surface to form a one-piece structure by chemical crosslinking.

Optionally, the first moisture-oxygen-blocking organic layer and the second moisture-oxygen-blocking organic layer have the same material.

Optionally, the first moisture-oxygen-blocking organic layer and the second moisture-oxygen-blocking organic layer comprise a polydimethyl siloxane-based moisture-oxygen-blocking layer.

Optionally, the encapsulation unit further comprises a first inorganic layer and a second inorganic layer,
wherein
the first inorganic layer covers the surface of the function layers;
the second moisture-oxygen-blocking organic layer covers the first inorganic layer; and
the second inorganic layer covers the second moisture-oxygen-blocking organic layer.

Optionally, the first substrate and the second substrate comprise a polyimide-based substrate.

Optionally, the display device comprises an OLED display device.

In another aspect, this disclosure provides an array substrate, comprising the display device mentioned above.

In still another aspect, this disclosure provides a display apparatus, comprising the display device mentioned above.

In further another aspect, this disclosure provides a method for producing the display device mentioned above, comprising:
providing the base substrate, which comprises the first substrate, the first moisture-oxygen-blocking organic layer on the first substrate, and the second substrate on the first moisture-oxygen-blocking organic layer;
forming the function layers on the second substrate;
forming the second moisture-oxygen-blocking organic layer on the function layers, to allow the second moisture-oxygen-blocking organic layer to be in contact with the first moisture-oxygen-blocking organic layer around the function layers; and
allowing the second moisture-oxygen-blocking organic layer to be combined with the first moisture-oxygen-blocking organic layer at the contact surface to form a one-piece structure.

Optionally, the second moisture-oxygen-blocking organic layer combines with the first moisture-oxygen-blocking organic layer at the contact surface to form a one-piece structure by chemical crosslinking.

Optionally, the method further comprises performing an activating treatment to the area for the contact in the first moisture-oxygen-blocking organic layer, before allowing the second moisture-oxygen-blocking organic layer to be in contact with the first moisture-oxygen-blocking organic layer around the function layers.

Optionally, the first moisture-oxygen-blocking organic layer and the second moisture-oxygen-blocking organic layer comprise a polydimethyl siloxane-based moisture-oxygen-blocking layer,
the activating treatment is a treatment of forming a surface silicon hydroxy group by oxygen plasma,
the first moisture-oxygen-blocking organic layer combines with the second moisture-oxygen-blocking organic layer to form a one-piece structure by forming a Si—O—Si covalent bond.

Optionally, the method further comprises forming a first inorganic layer on the function layers, before forming the second moisture-oxygen-blocking organic layer, and
covering a second inorganic layer on the second moisture-oxygen-blocking organic layer, after allowing the second moisture-oxygen-blocking organic layer to be combined with the first moisture-oxygen-blocking organic layer at the contact surface to form a one-piece structure.

Optionally, the providing the base substrate comprises:

covering the first substrate with the first moisture-oxygen-blocking organic layer, covering the first moisture-oxygen-blocking organic layer with the second substrate, and removing a part of the second substrate, to exposing a part of the first moisture-oxygen-blocking organic layer for enabling the second moisture-oxygen-blocking organic layer to be in contact with the first moisture-oxygen-blocking organic layer around the function layers.

BRIEF DESCRIPTION OF DRAWINGS

In order to describe the technical solutions in examples of this disclosure or in the related art more clearly, drawings needed to be used in illustration for examples or in the related art will be described briefly below. Obviously, the drawings in the description below are only some examples of this disclosure.

For a person skilled in the art, other drawings may be obtained according to these drawings without inventive labor.

DETAILED EMBODIMENTS

Figure 1:
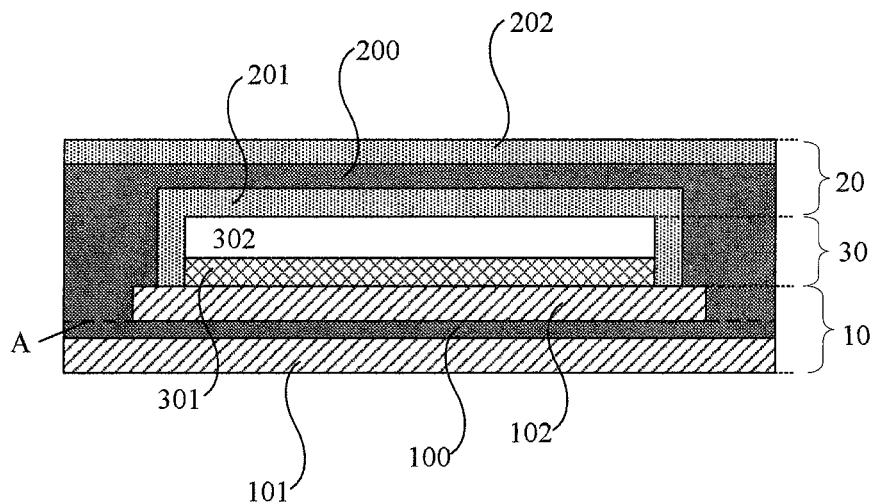
FIG. 1 is a schematic structural drawing of an encapsulation structure-containing display device provided in an example of this disclosure.

The technical solutions in examples of this disclosure will be described clearly and fully by incorporating drawings in examples of this disclosure. Obviously, the examples described only a part of examples of this disclosure, but not all examples. On the basis of the examples in this disclosure, all other examples obtained by a person skilled in the art without inventive labor belong to the protection scope of this disclosure.

The reference numerals in the drawings include: 10—base substrate; 100—first moisture-oxygen-blocking organic layer; 101—first substrate; 102—second substrate; 20—encapsulation unit; 200—second moisture-oxygen-blocking organic layer; 201—first inorganic layer; 202—second inorganic layer; 30—function layers; 301-TFT array; 302—other function layers; A—contact surface.

Typically, the encapsulation method for an OLED includes two types, i.e. the Frit encapsulation and the thin film encapsulation (TFE). For a rigid OLED display, the Frit encapsulation is normally used, while TFE is normally used for a flexible OLED display. However, for the above-mentioned encapsulations, especially for TFE, the bonding strength between the layers at the side faces is low. Therefore, the effect of encapsulation at the side faces is relatively poor, so that the moisture and oxygen can easily enter the display panel from the side faces, and further damage the OLED device.

An example of this disclosure provides an encapsulation structure-containing display device, a method for producing the same, an array substrate and a display apparatus, which may reduce the probability of entrance of moisture and oxygen in the environment into the display device from the side faces.

An example of this disclosure provides an encapsulation structure-containing display device, as shown in FIG. 1. The encapsulation structure-containing display device comprises a base substrate 10, function layers 30 on the base substrate 10, and an encapsulation unit 20 on the function layers 30. The encapsulation unit 20 is in contact with the base substrate 10 around the function layers 30, to encapsulate the function layers 30.

As shown in FIG. 1, the base substrate 10 in this disclosure comprises a first substrate 101, a first moisture-oxygen-blocking organic layer 100 on the first substrate 101, and a second substrate 102 on the first moisture-oxygen-blocking organic layer 100. The function layers 30 are on the second substrate 102. The encapsulation unit 20 comprises a second moisture-oxygen-blocking organic layer 200, wherein the second moisture-oxygen-blocking organic layer 200 is in contact with the first moisture-oxygen-blocking organic layer 100 around the function layers 30 and combines with the first moisture-oxygen-blocking organic layer 100 at the contact surface A to form an one-piece structure.

It should be explained that the above-mentioned combining to form an one-piece structure at the contact surface A refers to that the two layers at the contact surface A are not adhered together by the Van der Waals force or hydrogen bond force between molecules, but combined together to form an one-piece structure by covalent bonds or ionic bonds generated by the chemical reaction between the first moisture-oxygen-blocking organic layer 100 and the second moisture-oxygen-blocking organic layer 200 at the contact surface A. In other words, the first moisture-oxygen-blocking organic layer 100 and the second moisture-oxygen-blocking organic layer 200 at the contact surface A are bonded permanently. Particularly, the second moisture-oxygen-blocking organic layer 200 is in contact with the first moisture-oxygen-blocking organic layer 100 around the function layers 30, and they may form a permanently bonded one-piece structure in the manner of covalent bonds by chemical crosslinking at the contact surface A. However, the disclosure is not limited thereto.

Function layers 30 refer to various function layers of the display device, except the base substrate. In other words, function layers mentioned in this disclosure include the components in conventional display devices, excluding the base substrate. For example, when the display device is an OLED display device, the function layers may comprise the assembly of organic electroluminescent layer, electron injection layer, electron transfer layer, hole injection layer, hole transfer layer, and the like. Function layers may also comprise other components, such as a TFT array, electrodes, and the like. Generally, in the related art of TFE, an encapsulation unit comprising a thin film covers the function layers located on the base substrate. The encapsulation unit and the base substrate together encapsulate the portion of the display device excluding the base substrate (i.e. the function layers). In the encapsulation structure-containing display device of this disclosure, the encapsulation unit and the first moisture-oxygen-blocking organic layer are integrated, so that the function layers may be encapsulated better, and the probability of entrance of moisture and oxygen in the environment into the display device from the side faces may be reduced.

Thus, as compared with the encapsulation structure in the related art, in which moisture and oxygen can easily enter the display device at the location between the layers at the side faces, the first moisture-oxygen-blocking organic layer in this disclosure is in contact with the second moisture-oxygen-blocking organic layer at the side faces, and they combine at the contact surface to form an one-piece structure. Therefore, an one-piece structure is present at the side faces of the encapsulation structure, so that the probability of entrance of moisture and oxygen in the environment into the display device through the encapsulation structure from the side faces is reduced.

On the basis of above, this disclosure does not limit the specific materials of the first moisture-oxygen-blocking organic layer 100 and the second moisture-oxygen-blocking organic layer 200 mentioned above. The material of the first moisture-oxygen-blocking organic layer 100 and the material of the second moisture-oxygen-blocking organic layer 200 may be the same or different, as long as the first moisture-oxygen-blocking organic layer 100 may combine with the second moisture-oxygen-blocking organic layer 200 to form an one-piece structure at the contact surface A.

For simplifying the production process and ensuring that the first moisture-oxygen-blocking organic layer 100 and the second moisture-oxygen-blocking organic layer 200 may form the one-piece structure effectively, the materials of the first moisture-oxygen-blocking organic layer 100 and the second moisture-oxygen-blocking organic layer 200 is preferably the same in this disclosure. For example, the first moisture-oxygen-blocking organic layer 100 and the second moisture-oxygen-blocking organic layer 200 may comprises a polydimethyl siloxane (PDMS) material that has relatively good moisture-oxygen-blocking property. The first moisture-oxygen-blocking organic layer 100 combines with the second moisture-oxygen-blocking organic layer 200 to form an one-piece structure by permanent bonding via a Si—O—Si covalent bond formed by chemical crosslinking at the contact surface A. The first moisture-oxygen-blocking organic layer 100 and the second moisture-oxygen-blocking organic layer 200 may also use other materials, for example, modified PDMS material. The materials are not limited herein.

Further, examples of this disclosure also provide an array substrate and a display apparatus, which comprise the above-mentioned encapsulation structure-containing display device and have the same structure and beneficial effects as those of the display device provided in the example above. Since the example above has described the beneficial effects of the encapsulation structure-containing display device, the effects are not repeated here again. This disclosure will be further described by the examples below, referring to the display device, display apparatus, and the array substrate mentioned above.

In this disclosure, the function layers 30 may be the function layers of an organic light-emitting diode (OLED). In this case, the display apparatus may be an OLED display panel, or any display products comprising an OLED display panel. For an OLED display panel, the above-mentioned function layers 30 may comprise a TFT array 301 and an assembly of the other function layers 302 (e.g. including the organic light-emitting layer, etc.), as shown in FIG. 1. Additionally, the function layers 30 may also be the function layers of a semiconductor light-emitting diode. The function layers are not limited in this disclosure. As long as the function layers of a display device need to be encapsulated, the encapsulation structure of this disclosure may be used.

For simplifying the explanation, the OLED device is used in the following examples as the example, to describe further this disclosure.

The encapsulation structure-containing display device of this disclosure may relate to the Frit encapsulation and TFE encapsulation. In the case of TFE, it may be thin film encapsulation for a flexible display apparatus, and may also be thin film encapsulation for a non-flexible display apparatus. The type of encapsulation is not limited in this disclosure. In view of the flexibility of the material of the flexible display apparatus and bending for multiple times in practice, the flexible display apparatus has higher requirement for the encapsulation effect of the encapsulation structure. On the basis of this, for the flexible display apparatus, the encapsulation structure having the one-piece structure at the side faces in this disclosure has advantages in blocking the moisture and oxygen, as compared with the existing encapsulation structure.

The thin film encapsulation and specific configuration of the thin film encapsulation using the encapsulation structure of this disclosure in the field of the flexible display apparatus will be described in details below.

In the thin film encapsulation, the encapsulation unit may use a configuration, in which an organic layer and an inorganic layer are provided alternatively. As shown in FIG. 1, the encapsulation unit 20 may comprise the first inorganic layer 201 and the second inorganic layer 202 covering the surface of the function layers 30, wherein the second moisture-oxygen-blocking organic layer 200 covers the first inorganic layer 201, and the second inorganic layer 202 covers the second moisture-oxygen-blocking organic layer 200. The edge of the second moisture-oxygen-blocking organic layer 200 should go beyond the edge of the first inorganic layer 201, to ensure that the second moisture-oxygen-blocking organic layer 200 may be in contact with the first moisture-oxygen-blocking organic layer 100 around the function layers.

Additionally, the above-mentioned base substrate 10 also comprises the second substrate 102. The second substrate 102 is located on the side of the first moisture-oxygen-blocking organic layer 100 being away from the first substrate 101. In other words, the base substrate 10 comprises the first substrate 101, the first moisture-oxygen-blocking organic layer 100, and the second substrate 102 provided sequentially, to satisfy the practical function of the base substrate 10. Here, the first substrate 101 and the second substrate 102 in the base substrate 10 may comprise polyimide (PI), or substantially consist thereof. This disclosure is not limited thereto. Polyethylene terephthalate (PET), Polyethylene naphthalate (PEN), polyvinyl chloride (PVC), polytetrafluoroethylene (PTFE), and the like may also be used.

Figure 2:
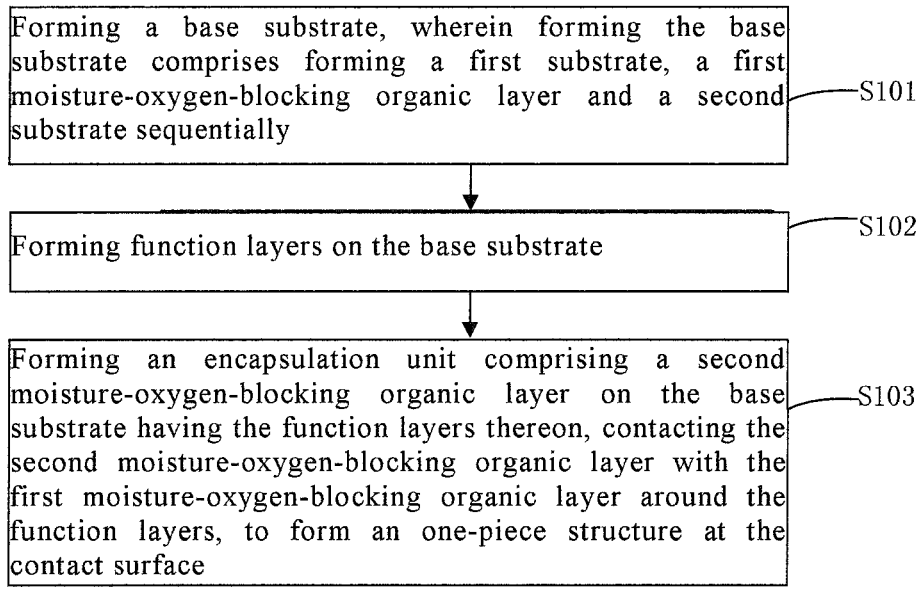
FIG. 2 is a schematic flow chart of a method for producing an encapsulation structure-containing display device provided in an example of this disclosure.

An example of this disclosure also provides a method for producing the above-mentioned display device, or in other words, a method for encapsulating a display device. As shown in FIG. 2, the encapsulation method comprises the following steps. Concerning the specific structure, reference may be made to FIG. 1.

Step S101. Forming a base substrate 10, wherein forming the base substrate 10 comprises forming the first substrate 101, the first moisture-oxygen-blocking organic layer 100 and the second substrate 102 sequentially Specifically, PI material is generally used for the first substrate 101 and second substrate 102. PDMS material may be used for the first moisture-oxygen-blocking organic layer 100. The base substrate may be formed in the manner of thermal curing, wherein the temperature of the thermal curing may be 60° C.-100° C.

Step S102. Forming function layers 30 on the base substrate 10

For an OLED display apparatus, this step may specifically comprise: forming a TFT array 301 and other function layers 302 of the OLED on the base substrate 10 sequentially. The other function layers 302 may comprise the electron injection layer, electron transfer layer, organic light-emitting layer, hole transfer layer, hole injection layer, and the like, which are known in the art.

Step S103. Forming an encapsulation unit 20 comprising a second moisture-oxygen-blocking organic layer 200 on the base substrate 10 having the function layers 30 thereon, contacting the second moisture-oxygen-blocking organic layer 200 with the first moisture-oxygen-blocking organic layer 100 around the function layers, to form an one-piece structure at the contact surface Thus, as compared with the encapsulation structure in the related art, in which moisture and oxygen can easily enter the display device at the location between the layers at the side faces, the first moisture-oxygen-blocking organic layer in this disclosure is in contact with the second moisture-oxygen-blocking organic layer at the side faces, and they combine at the contact surface to form an one-piece structure. Therefore, an one-piece structure is present at the side faces of the encapsulation structure, so that the probability of entrance of moisture and oxygen in the environment into the display device through the encapsulation structure from the side faces is reduced.

A specific process of above-mentioned combining the second moisture-oxygen-blocking organic layer 200 with the first moisture-oxygen-blocking organic layer 100 to form an one-piece structure at the contact surface is provided below schematically.

Figure 3:
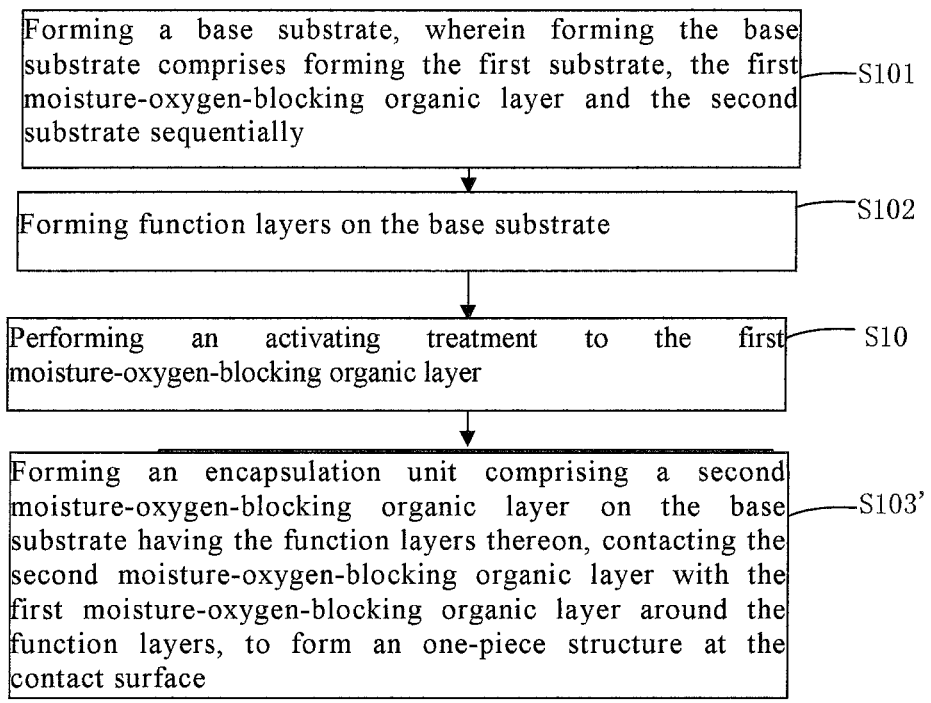
FIG. 3 is a schematic flow chart of another method for producing an encapsulation structure-containing display device provided in an example of this disclosure.

For example, as shown in FIG. 3, the encapsulation method mentioned above further comprises the following steps. The order of the number of the following steps does not represent the necessary order of the production.

Step S10. Performing an activating treatment to the first moisture-oxygen-blocking organic layer 100

It should be understood that this step is performing an activating treatment to the area of the first moisture-oxygen-blocking organic layer 100 corresponding to the zone around the function layers. Therefore, this step must be carried out after the first moisture-oxygen-blocking organic layer 100 has been formed. Further, since the purpose of this activating treatment is to ensure that the second moisture-oxygen-blocking organic layer 200 may combine with the first moisture-oxygen-blocking organic layer 100 in the activated area to form the one-piece structure, the step must be carried out before forming the second moisture-oxygen-blocking organic layer 200.

In this case, the contacting the second moisture-oxygen-blocking organic layer with the first moisture-oxygen-blocking organic layer around the function layers to form an one-piece structure at the contact surface in the above-mentioned Step S103 (S103' in FIG. 3) comprises: contacting the second moisture-oxygen-blocking organic layer with the first moisture-oxygen-blocking organic layer treated by the activating treatment around the function layers, to form an one-piece structure at the contact surface by chemical crosslinking.

Specifically, by using PDMS for the first moisture-oxygen-blocking organic layer 100 as an example, oxygen plasma is used to perform activating treatment to the first moisture-oxygen-blocking organic layer 100 in the area corresponding to the zone around the function layers. A silicon hydroxy group (Si—OH) is formed at the surface. That is to say, a silicon hydroxy group (Si—OH) is formed on the surface of the first moisture-oxygen-blocking organic layer 100 corresponding to the zone around the function layers.

On the basis of this, PDMS material may also be used for the second moisture-oxygen-blocking organic layer 200. In this case, the second moisture-oxygen-blocking organic layer 200 is in contact with the first moisture-oxygen-blocking organic layer 100 around the function layers, to form covalent bonds of Si—O—Si by chemical crosslinking at the contact surface. This allows the first moisture-oxygen-blocking organic layer 100 and the second moisture-oxygen-blocking organic layer 200 to form an one-piece structure bonded permanently by the covalent bonds at the contact surface by chemical crosslinking.

It should be explained that in the case where PDMS material is used for the first moisture-oxygen-blocking organic layer 100 and the second moisture-oxygen-blocking organic layer 200, the bonding between the first moisture-oxygen-blocking organic layer 100 and the second moisture-oxygen-blocking organic layer 200 may be ensured by the manner of thermal curing. Since the encapsulation structure has involved the function layers 30 when the second moisture-oxygen-blocking organic layer 200 is thermally cured, a relatively low thermal curing temperature, e.g. not more than 60° C., may be set for the second moisture-oxygen-blocking organic layer 200, in order to avoid damaging the function layer 30 due to a too high thermal curing temperature.

Figure 4:
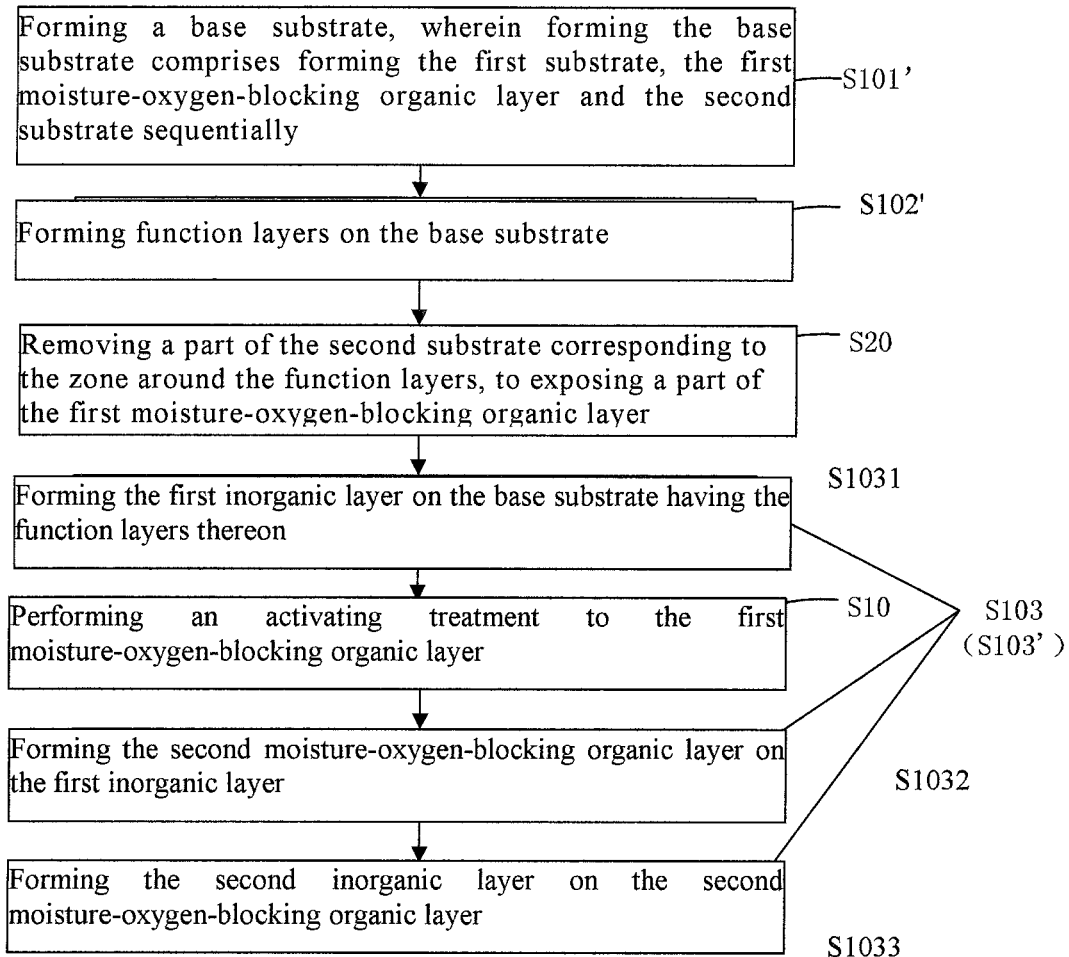
FIG. 4 is a schematic flow chart of still another method for producing an encapsulation structure-containing display device provided in an example of this disclosure.

Additionally, it should be explained when the second substrate 102 completely covers the first moisture-oxygen-blocking organic layer 100 and thus shields the first moisture-oxygen-blocking organic layer 100, the activating treatment in the Step S10 cannot be carried out. Therefore, in this case, as shown in FIG. 4, the encapsulation method further comprises the following step before the activating treatment in Step S10.

Step S20. Removing a part of the second substrate 102 corresponding to the zone around the function layers, to exposing a part of the first moisture-oxygen-blocking organic layer 100

Specifically, in this Step S20, the second substrate 102 alone may be cut in the area corresponding to the zone around the function layers in a manner of half-cutting. Thereafter, upon the whole base substrate being heated (for example, up to about 100° C.), the cut portion of the second substrate 102 is peeled off and removed, to expose the first moisture-oxygen-blocking organic layer 100. The manner is not limited thereto. Other removing method may be used to expose the first moisture-oxygen-blocking organic layer 100.

Figure 5:
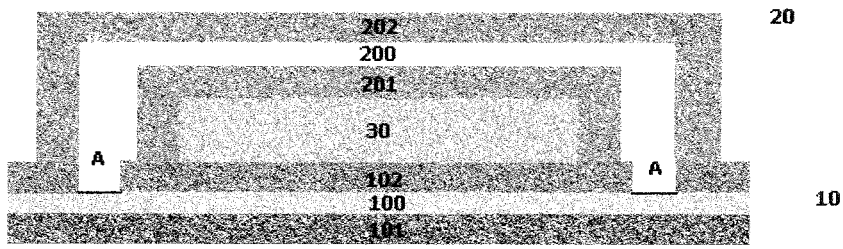
FIG. 5 is a schematic structural drawing of another encapsulation structure-containing display device provided in an example of this disclosure.

The second substrate 102 may be remained except the area where the first moisture-oxygen-blocking organic layer 100 is exposed. As shown in FIG. 5, the first moisture-oxygen-blocking organic layer 100 may be only exposed in the zone around the function layers. The area of the exposed surface is not limited, as long as sufficient contact surface may be formed.

Further, for TFE, as shown in FIG. 4, the Step S103 or S103' of forming an encapsulation unit 20 comprising a second moisture-oxygen-blocking organic layer on the base substrate having the function layers thereon may specifically comprise the steps of:

Step S1031. Forming the first inorganic layer 201 on the base substrate 10 having the function layers 30 thereon, Step S1032. Forming the second moisture-oxygen-blocking organic layer 200 on the first inorganic layer 201, and Step S1033. Forming the second inorganic layer 202 on the second moisture-oxygen-blocking organic layer 200.

In order to ensure that the second moisture-oxygen-blocking organic layer 200 may be in contact with the first moisture-oxygen-blocking organic layer 100 treated by the activating treatment in the base substrate 10 in the area corresponding to the zone around the function layers, the edge of the second moisture-oxygen-blocking organic layer 200 should go beyond the edge of the first inorganic layer 201. Additionally, for specific production of the organic layer and the inorganic layer, typically, the inorganic layer may be patterned directly by using a mask, while the organic layer may be deposited in a full-layer, and then be patterned by a patterning process (exposing, etching, peeling, etc.).

Therefore, in order to avoid exposing the surface of the first moisture-oxygen-blocking organic layer 100 treated by the activating treatment in the air for long time and thereby resulting in the reduction of the number of the activated groups, which further causes a poor chemical crosslinking effect, it is preferred in this disclosure that the step of forming the second moisture-oxygen-blocking organic layer 200 is performed immediately upon the activating treatment to the first moisture-oxygen-blocking organic layer 100. For TFE, i.e. in the case where the above-mentioned Step 103 or S103' comprises Steps S1031, S1032 and S1033, the above-mentioned Step S10 is preferably between the Step S1031 of forming the first inorganic layer 201 and the Step S1032 of forming the second moisture-oxygen-blocking organic layer 200, as shown in FIG. 4.

On the basis of above, in order to avoid that the layers in the encapsulation unit 20 get loose during removing the part of the second substrate 102 in the Step S20, as well as the resultant negative effect on the display device, the above-mentioned Step S20 is preferably carried out before the Step S103 or S103' of forming the encapsulation unit in this disclosure, as shown in FIG. 4.

An example of this disclosure provides an encapsulation structure-containing display device, comprising a base substrate, function layers on the base substrate, and an encapsulation unit on the function layers, wherein the encapsulation unit is in contact with the base substrate around the function layers, to encapsulate the function layers; wherein the base substrate comprises a first substrate, a first moisture-oxygen-blocking organic layer on the first substrate, and a second substrate on the first moisture-oxygen-blocking organic layer; wherein the function layers are on the second substrate; wherein the encapsulation unit comprises a second moisture-oxygen-blocking organic layer, wherein the second moisture-oxygen-blocking organic layer is in contact with the first moisture-oxygen-blocking organic layer around the function layers and combines with the first moisture-oxygen-blocking organic layer at the contact surface to form an one-piece structure. Thus, as compared with the encapsulation structure in the related art, in which moisture and oxygen can easily enter the display device at the location between the layers at the side faces, in this disclosure the first moisture-oxygen-blocking organic layer is in contact with the second moisture-oxygen-blocking organic layer at the side faces, and they combine at the contact surface to form an one-piece structure. Therefore, an one-piece structure is present at the side faces of the encapsulation structure, so that the probability of entrance of moisture and oxygen in the environment into the display device through the encapsulation structure from the side faces is reduced.

The contents described above are only embodiments of this disclosure. However, the protection scope of this disclosure is not limited thereto. Any change or modification that may be envisaged easily by a person skilled in the technical field of this disclosure should be involved in the protection scope of this disclosure. Therefore, the protection scope should comply with the protection scope of the claims.

The invention claimed is:

1. An encapsulation structure-containing display device, comprising
    a base substrate,
    function layers on the base substrate, and
    an encapsulation unit on the function layers,
    wherein the encapsulation unit is in contact with the base substrate around the function layers, to encapsulate the function layers;
    wherein the base substrate comprises a first substrate, a first moisture-oxygen-blocking organic layer on the first substrate, and a second substrate on the first moisture-oxygen-blocking organic layer;
    wherein the function layers are on the second substrate;
    wherein the encapsulation unit comprises a second moisture-oxygen-blocking organic layer, wherein the second moisture-oxygen-blocking organic layer is in contact with the first moisture-oxygen-blocking organic layer around the function layers and combines with the first moisture-oxygen-blocking organic layer at the contact surface to form an one-piece structure,
    wherein the first moisture-oxygen-blocking organic layer and the second moisture-oxygen-blocking organic layer comprise a polydimethyl siloxane-based moisture-oxygen-blocking layer,
    wherein the second moisture-oxygen-blocking organic layer combines with the first moisture-oxygen-blocking organic layer at the contact surface to form a one-piece structure by forming a Si—O—Si covalent bond.

2. The display device according to claim 1, wherein the encapsulation unit further comprises a first inorganic layer and a second inorganic layer,
    wherein
    the first inorganic layer covers the surface of the function layers;
    the second moisture-oxygen-blocking organic layer covers the first inorganic layer; and
    the second inorganic layer covers the second moisture-oxygen-blocking organic layer.

3. The display device according to claim 1, wherein the first substrate and the second substrate comprise a polyimide-based substrate.

4. The display device according to claim 1, wherein the display device comprises an OLED display device.

5. An array substrate, comprising the display device according to claim 1.

6. A display apparatus, comprising the display device according to claim 1.

7. A method for producing the display device according to claim 1, comprising:
    providing the base substrate, which comprises the first substrate, the first moisture-oxygen-blocking organic layer on the first substrate, and the second substrate on the first moisture-oxygen-blocking organic layer;
    forming the function layers on the second substrate;
    forming the second moisture-oxygen-blocking organic layer on the function layers, to allow the second moisture-oxygen-blocking organic layer to be in contact with the first moisture-oxygen-blocking organic layer around the function layers, wherein the first moistureoxygen-blocking organic layer and the second moisture-oxygen-blocking organic layer comprise a polydimethyl siloxane-based moisture-oxygen-blocking layer;

performing an activating treatment to the area for the contact in the first moisture-oxygen-blocking organic layer, wherein the activating treatment is a treatment of forming a surface silicon hydroxy group by oxygen plasma; and allowing the second moisture-oxygen-blocking organic layer to be combined with the first moisture-oxygen-blocking organic layer at the contact surface to form an one-piece structure by forming a Si—O—Si covalent bond.

8. The method according to claim 7, further comprising forming a first inorganic layer on the function layers, before forming the second moisture-oxygen-blocking organic layer, and
covering a second inorganic layer on the second moisture-oxygen-blocking organic layer, after allowing the second moisture-oxygen-blocking organic layer to be combined with the first moisture-oxygen-blocking organic layer at the contact surface to form an one-piece structure.

9. The method according to claim 7 wherein the providing the base substrate comprises:
covering the first substrate with the first moisture-oxygen-blocking organic layer,
covering the first moisture-oxygen-blocking organic layer with the second substrate, and
removing a part of the second substrate, to exposing a part of the first moisture-oxygen-blocking organic layer for enabling the second moisture-oxygen-blocking organic layer to be in contact with the first moisture-oxygen-blocking organic layer around the function layers.

* * * * *